(12) United States Patent
Busscher et al.

(10) Patent No.: US 6,650,457 B2
(45) Date of Patent: Nov. 18, 2003

(54) REARVIEW MIRROR CONSTRUCTED FOR EFFICIENT ASSEMBLY

(75) Inventors: Bradley L. Busscher, Grand Rapids, MI (US); Bradley L. Northman, Belmont, MI (US); Kenton J. Ypma, Hudsonville, MI (US); Randall J. Beute, Grand Rapids, MI (US); John K. Roberts, Grand Rapids, MI (US); Wayne M. Jordan, Grandville, MI (US); Edward L. DeNave, Zeeland, MI (US); Daniel J. Bostwick, Grandville, MI (US); Randall S. Braun, Grand Rapids, MI (US); Gregory A. Bosch, Grandville, MI (US); Timothy A. Bonardi, Buchanan, MI (US)

(73) Assignee: Gentex Corporation, Zeeland, MI (US)

( * ) Notice: Subject to any disclaimer, the term of this patent is extended or adjusted under 35 U.S.C. 154(b) by 71 days.

(21) Appl. No.: 09/862,414

(22) Filed: May 21, 2001

(65) Prior Publication Data

US 2002/0171906 A1 Nov. 21, 2002

(51) Int. Cl.[7] .............................. G02F 1/15; G02B 5/12; G02B 7/182; B60R 1/12; B60Q 1/56
(52) U.S. Cl. ...................... 359/265; 359/515; 359/877; 362/494; 362/498
(58) Field of Search ................................ 359/876, 877, 359/512, 514, 265, 267, 274; 362/494, 498

(56) References Cited

U.S. PATENT DOCUMENTS

| | | | |
|---|---|---|---|
| 5,151,824 A | * | 9/1992 | O'Farrell .................... 359/604 |
| 6,111,684 A | * | 8/2000 | Forgette et al. ............. 359/267 |
| 6,124,886 A | * | 9/2000 | DeLine et al. .............. 348/148 |
| 6,166,848 A | | 12/2000 | Cammenga et al. |
| 6,195,194 B1 | | 2/2001 | Roberts et al. |
| 6,264,353 B1 | | 7/2001 | Carraher et al. |
| 2002/0171906 A1 | * | 11/2002 | Busscher et al. ........... 359/265 |
| 2002/0171954 A1 | * | 11/2002 | Bonardi et al. ............. 359/887 |

OTHER PUBLICATIONS

Prior art brochure disclosing mirror heaters in prior art, published by ITW ChronoTherm Company, a division of Illinois Tool Works, Elmhurst, Illinois, publication date unknown.

* cited by examiner

Primary Examiner—David N. Spector
(74) Attorney, Agent, or Firm—Brian J. Rees; Price, Heneveld, Cooper, DeWitt & Litton

(57) ABSTRACT

A mirror assembly includes a housing, an angularly adjustable power pack, wires for supplying power and mirror angle control, an electrochromic mirror subassembly including a heater, and a turn signal device. The components include individual connectors that plug into a multi-prong connector on the bundle of wires, or that piggyback into each other. Optionally, the heater incorporates an internal wire with end connectors for communicating power to opposite sides of the heater, and also includes layers of light-transmitting/diffusing material for diffusing light passing from the turn signal device through the diffusing material. A printed circuit board fits into a pocket in the panel-shaped carrier, and an integral retainer releasably secures the printed circuit board. The power pack is attached to the carrier via a ring of resilient fingers, and a continuous hoop flange prevents distortion of the carrier and in turn of the glass elements in the mirror subassembly.

62 Claims, 5 Drawing Sheets

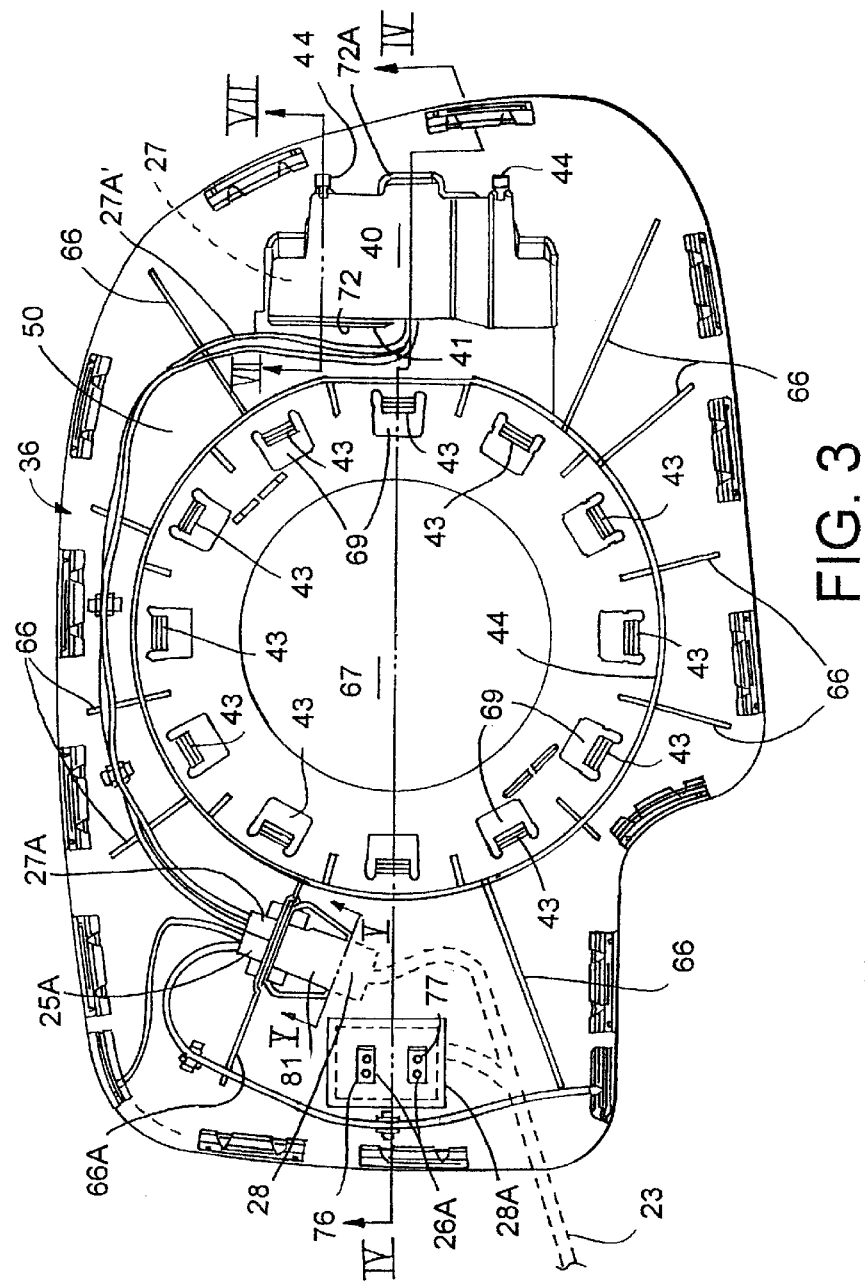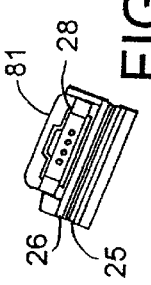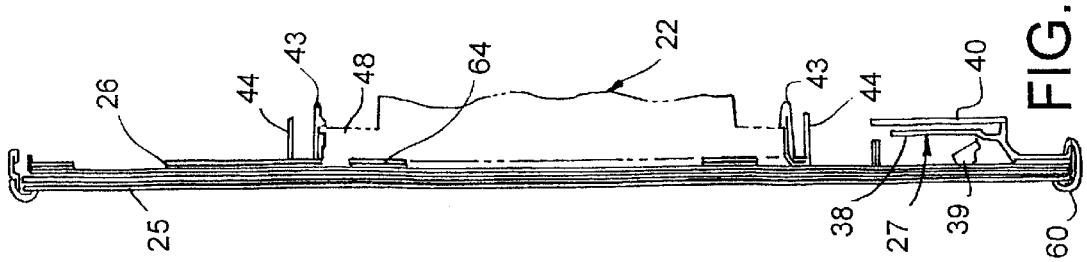

REARVIEW MIRROR CONSTRUCTED FOR EFFICIENT ASSEMBLY

BACKGROUND

The present invention relates to a rearview mirror for vehicles constructed for efficient and optimal assembly, including components shaped for efficient and low-scrap molding and manufacture, components having features integrated into them to reduce the overall number of parts, pieces, and total weight, and components arranged to facilitate mechanical assembly and physical layout as well as electrical interconnection and repair of electrical circuits.

Modern vehicle mirrors often include numerous electrical components that must be powered and also controlled. For example, the electrical components of one proposed high-end exterior mirror will include an electrochromic image-darkening mirror subassembly and control circuit, a heater, a turn signal, and a powered angular adjustment mechanism. Other mirrors, such as interior mirrors, include a multitude of sensors, buttons, and readouts/displays. Routing of wires to support the various electrical components can be a logistic nightmare, and further, even if routed carefully and consistently, can take up considerable space. Also, most mirror designs provide electrical connectors so that the mirror can be electrically coupled to a vehicle's electrical system on or about the same time as the mirror is mechanically attached to the vehicle. It is desirable to reduce the amount of time that it takes to arrange wiring and connectors on the mirror, and to reduce the amount of time it takes to manipulate connectors and then electrically connect the multiple electrical components of a mirror to each other and to the vehicle electrical system.

Another problem caused by multiple components in a mirror is that the mirror becomes thicker in order to make room for the wiring and connectors and also heavier due to the connectors, wires, and related support structure. Modern vehicles place a high emphasis on low weight and small size, especially for non-visible components. Weight, even in small amounts, is an issue in electrochromic mirror subassemblies because these mirrors use a pair of glass elements with an electrochromic layer therebetween. They also require the supporting circuitry and hardware. Glass has a relatively high specific gravity, and since electrochromic mirror subassemblies require a pair of glass elements, these mirror subassemblies tend to be heavier than non-electrochromic mirrors. In opposition to the issue of reducing weight by reducing glass thickness, glass elements must be thick enough to prevent distortion of reflected images, since this is related to a vehicle driver's ability to see around and safely drive a vehicle. Most existing mirror glass elements in EC mirror subassemblies are about 2.2-mm in thickness or greater. Vehicle manufacturers have hesitated going below this thickness because the glass elements will bend too easily, resulting in distortion of the reflected images. Further, a way is needed to support the glass elements in a non-stressed manner, especially during wide temperature fluctuations and other stress-rising incidents that occur in the environment of a vehicle in service.

Further, it is preferable that various functions and features be well integrated into the components of a mirror assembly to minimize the total number of parts and pieces. At the same time, it is often desirable to maintain reparability so that expensive components do not have to be scrapped and thrown away when a defect occurs in other components during the last few steps of a manufacturing process for the mirror. There is tension between the concept of "integrated features and components" and "reparability" when trying to optimize a mirror for manufacture. For example, "well integrated features and components" tend to require less electrical connectors and less manual assembly (i.e. since the components are integrated into the mirror), and initially cost less as a result. However, sometimes it is desirable to add electrical connectors so that defective components can be removed and replaced and so that scrap can be better controlled and/or so that assembly efficiency can be improved.

Recently, some manufacturers are considering placing a turn signal in an exterior vehicle mirror. This can cause several difficulties and complications in a mirror. For example, the light-generating turn signal device adds weight and takes up space, such that the resulting assembly is potentially heavier and larger than mirror assemblies not having this feature. Further, the turn signal device requires additional wiring within the mirror assembly, which can cause assembly concerns related to electrical connections and positioning of connectors, as discussed above. Further, a defective turn signal device non-removably attached to an electrochromic mirror subassembly can result in scrapping out and throwing away a "good" electrochromic mirror subassembly, which is a relatively expensive portion of the overall assembly at that same point in time. At the same time, it is desirable to securely attach the turn signal device to the mirror assembly so that it does not come loose while in service. One reason is because, if the turn signal device came loose in an exterior mirror assembly, dirt and light-blocking matter would soon cover the turn signal device, rendering it ineffective. Also, it could rattle and cause other problems.

It is desirable to improve assembly of the electrochromic mirror subassembly to the angular adjustment mechanism (often called a "power pack"). Historically, the power pack includes an electrically-powered angularly-adjustable mount, and the electrochromic mirror subassembly includes a carrier with a connector having resilient fingers shaped to snappingly engage the adjustable mount. However, as the resilient fingers are flexed to engage and then do engage the adjustable mount, the glass-supporting area around the fingers is distorted. This can be a problem since, if the glass is less than about 2.2-mm thick and the carrier thickness is also minimized for reduced weight, the distortion of the glass-supporting area can read through to the glass, causing noticeable and objectionable distortions in the reflected images. Distortion of the glass-supporting area can be reduced by making the fingers flimsier and not as stiff, however this would result in a reduced retention force and less reliable connection of the electrochromic mirror subassembly to the power pack. Distortion of the glass-supporting area can also potentially be reduced by placement of perpendicular reinforcement webs on the carrier. This, however, adds weight and takes up considerable space if the reinforcement webs are made large enough to do an adequate job. Further, testing has shown that it is not a solution to this problem to merely add a few random reinforcement webs, since very minor bending in a direction perpendicular to the glass elements of the mirror subassembly in any localized area can result in objectionable glass distortions, especially with glass elements at or under 1.6-mm thickness. It is important that the insertion force for attaching the carrier to the adjustable mount not be too high of force, that it not be an inconsistent force, and yet that the retention force not permit looseness, sloppiness, poor and inconsistent retention forces.

In addition to the above, it is desirable to design a carrier for the EC mirror subassembly that can be molded with molding dies that are not complicated and that do not include a plurality of movable pulls and slides that are difficult to maintain. Pulls and slides in molding dies are well known, and are often used to mold parts. However, pulls and slides are expensive to build into a die and to maintain, and can result in increased scrap. Further, it is desirable to provide a carrier that provides ease and reliability of assembly, with few parts and pieces, especially having few small parts and pieces such as screws and separate fasteners that must be manipulated and/or connected without stripping.

Accordingly, a mirror assembly is desired solving the aforementioned problems and having the aforementioned advantages.

SUMMARY OF THE PRESENT INVENTION

In one aspect of the present invention, a mirror assembly includes an electrochromic mirror including a first connector operably connected to the electrochromic mirror, and an electrically-operated second component associated with the electrochromic mirror that includes a second connector operably connected to the electrically-operated second component. A primary wire bundle extends from and is configured to communicate power to the electrochromic mirror and to the electrically-operated second component, the primary wire bundle including a main connector. The first connector engages and is electrically connected to the main connector, and the second connector engages and is electrically connected to one of the main connector and the first connector. By this arrangement, the primary wire bundle is configured to communicate power to the electrochromic mirror and to the second component in a manner minimizing the number of electrical connections and connectors necessary during assembly to a mirror housing.

In another aspect of the present invention, a rearview mirror assembly for a vehicle includes a housing, and a mirror subassembly positioned in the housing and including a panel-shaped carrier. First and second electrically-operated components are associated with the mirror subassembly and include first and second connectors, respectively. A primary wire bundle extends from and is configured to communicate power to the first and second components, the primary wire bundle including a main connector. The first and second connectors engage and are electrically directly connected to the main connector. By this arrangement, the primary wire bundle and the first and second connectors are configured to communicate power to the first and second components in a manner minimizing the number of electrical connections necessary during assembly to a vehicle.

In another aspect of the present invention, a rearview mirror assembly for a vehicle includes a mirror subassembly, and a heater positioned relative to the mirror subassembly for heating the mirror subassembly. The heater includes a first connector on one side of the heater and a second connector on another side of the heater with an electrical conductor extending through and across the heater and connecting the first and second connectors. By this arrangement, electrical energy can be communicated by the electrical conductor to different sides of the heater for operating an electrically operated component associated with the mirror subassembly.

In a narrower form, the mirror assembly includes an electrically-operated second component associated with the mirror subassembly, the second component including a third connector engaging the second connector for electrifying the second component.

In still another narrower form, the rearview mirror assembly includes a primary wire bundle extending from and configured to communicate power to the heater and the second component, the primary wire bundle including a main connector engaging and electrically connected to the first connector, whereby the primary wire bundle is configured to communicate power to the first and second components in a manner optimizing the positions of electrical connections necessary during assembly to a vehicle.

In another aspect of the present invention, a rearview mirror assembly for a vehicle includes a mirror subassembly, and a heater positioned relative to the mirror subassembly for heating the mirror subassembly. The heater is multi-layered and includes a polymeric layer of light-transmitting material and includes another layer of opaque material with at least one aperture therein for letting light pass through to the light-transmitting material. At least a portion of the light-transmitting material covers the aperture and is configured to diffuse light passing through the portion. A light source directs light at the portion, with the portion diffusing the light so that the light passing therethrough is uniformly distributed.

In another aspect of the present invention, a mirror includes an electrochromic mirror subassembly including a panel-shaped carrier with flanges defining a pocket, and a printed circuit board positioned in the pocket. A releasable retainer releasably secures the printed circuit board in the pocket.

In another aspect of the present invention, an exterior rearview mirror includes a mirror subassembly including a panel-shaped carrier, and a printed circuit board attached to the panel-shaped carrier. The printed circuit board includes light-generating devices positioned in a visible location on the mirror subassembly to generate a visible turn signal and includes at least a portion of a circuit for controlling the light-generating devices. A retainer secures the printed circuit board to the mirror subassembly characteristically without using a separate housing for the printed circuit board.

In another aspect of the present invention, a mirror assembly includes a housing, and an adjustment device attached to the housing. The adjustment device includes an angularly adjustable mount. An electrochromic mirror subassembly includes front and rear glass elements and an electrochromic layer adapted to provide controlled darkening of reflected images, and further includes a panel-shaped carrier with a front surface shaped to uniformly support the rear glass element. The panel-shaped carrier includes a plurality of resilient retainers arranged in a circle. The resilient retainers extend rearwardly from the panel-shaped carrier and engage the adjustable mount. The panel-shaped carrier further includes a continuous hoop-shaped wall extending around and spaced radially from the plurality of resilient retainers. The hoop-shaped wall extends from the rear surface and supports an area around and proximate a base of the plurality of resilient retainers so that significant deflection of the panel-shaped carrier in the area of the resilient retainers is prevented even when the resilient retainers are stressed or have been stressed.

In still another aspect of the present invention, a mirror assembly includes a housing and an adjustment device attached to the housing. The adjustment device includes an angularly adjustable mount. An electrochromic mirror subassembly includes front and rear glass elements and an electrochromic layer adapted to provide controlled darkening of reflected images, and further including a panel-shaped carrier with a front surface shaped to uniformly support the rear glass element. The panel-shaped carrier includes a plurality of resilient retainers arranged in a circle and extending rearwardly from the panel-shaped carrier and engaging the adjustable mount. The retainers and adjustable mount are configured to positively engage for secure retention, but are also configured to provide an insertion attachment force of less than 50 pounds force (about 220 N) during assembly of the panel-shaped carrier to the adjustment device.

In yet another aspect of the present invention, an exterior mirror assembly includes a housing with an arm adapting the housing for attachment to a vehicle in a position outside of the vehicle. An adjustment device is attached to the housing and includes an angularly adjustable mount. A mirror subassembly includes an electrochromic mirror and a carrier for the electrochromic mirror. The carrier includes a panel-like surface supporting the electrochromic mirror and includes retainers engaging the adjustable mount. The carrier includes a plurality of apertures inboard of a perimeter of the carrier but outboard of a perimeter of the electrochromic mirror, and further, the mirror subassembly includes a bezel with a plurality of resilient hooks that extend past the perimeter of the electrochromic mirror and into the plurality of apertures.

It is an object of the present invention to provide a vehicle mirror that is particularly suited for use as a vehicle mirror, where the mirror includes numerous electrical components that must be powered and also controlled, including such components and features as electrochromic (EC) layers, heaters, turn signals, power packs for powered angular adjustment of the mirror subassembly, sensors, readouts and displays, and turn signals.

It is an object of the present invention to provide electrical connector arrangements that facilitate connection of multiple connectors with minimized manual labor, minimized expensive components, minimized space problems, and optimized locations.

It is an object of the present invention to integrate components to reduce redundant structure, to reduce overall thickness of the assembly, and to eliminate parts.

It is an object of the present invention to incorporate structure for the housing of the turn signal device into other structure within the mirror subassembly, as a way of reducing expense and assembly labor, saving space, saving material and reducing weight of the mirror assembly.

It is an object of the present invention to releasably hold the circuit board in the mirror subassembly, and hence provide a circuit board and electrical component arrangement that is serviceable and reparable in the field and also serviceable and reparable at the time of assembling the mirror assembly. In particular, it is an object to provide a mirror assembly process that reduces scrap and cost of scrap by allowing serviceability as late in the mirror assembly process as possible, and by attaching non-removable components as late as possible in the assembly process.

It is an object of the present invention to provide an electrochromic mirror subassembly that utilizes glass elements having a relatively thin thickness dimension, such as a thickness of 1.6-mm or as low as 1.1-mm or lower, and to support these glass elements in a stress-free and forgiving manner that minimizes distortion. In particular, an object is to provide a carrier that supports the glass elements with minimal stress, yet that allows snap-assembly of a mirror subassembly to a power pack, and that allows snap-assembly of a bezel to the mirror subassembly.

It is an object of the present invention to provide a minimized insertion force when attaching a mirror carrier to a power pack. In particular, it is desired that the insertion force not be unacceptably high, such as below 50 pounds force of insertion, but that it be a consistent force, that it be well-distributed and not be concentrated, that looseness and sloppiness be prevented, that the retention forces be non-distorting to the mirror glass elements, and that stresses resulting from environmental conditions such as temperature fluctuations not unacceptably bend glass elements and read through onto reflected images.

It is an object of the present invention to provide components that can be molded with molding dies that are relatively low-cost to build and maintain, such as by providing parts and components that can be molded using dies without movable pulls and without movable slides, which die pulls and slides are expensive to build into dies and to maintain.

It is an object of the present invention to construct a mirror assembly that includes components that are easy to build and assemble, and that can be assembled reliably and efficiently with low cost.

It is an object of the present invention to provide a mirror assembly that includes relatively few parts and pieces, especially small parts and pieces that must be manipulated and connected during assembly. It is desired to include in the mirror assembly fewer loose parts and pieces, especially parts and pieces that can be mislocated and that can get in the way and/or rattle and/or that must be accurately positioned during assembly.

These and other aspects, objects, and features of the present invention will be understood and appreciated by those skilled in the art upon studying the following specification, claims, and appended drawings.

BRIEF DESCRIPTION OF DRAWINGS

FIG. 3 is a rear view of the mirror subassembly, which shows the rear surface of the carrier and also the wiring and electrical connector arrangement;

FIGS. 4 and 5 are cross-sectional views taken along the lines IV—IV and V—V in FIG. 3;

DETAILED DESCRIPTION OF PREFERRED EMBODIMENTS

Figure 1:
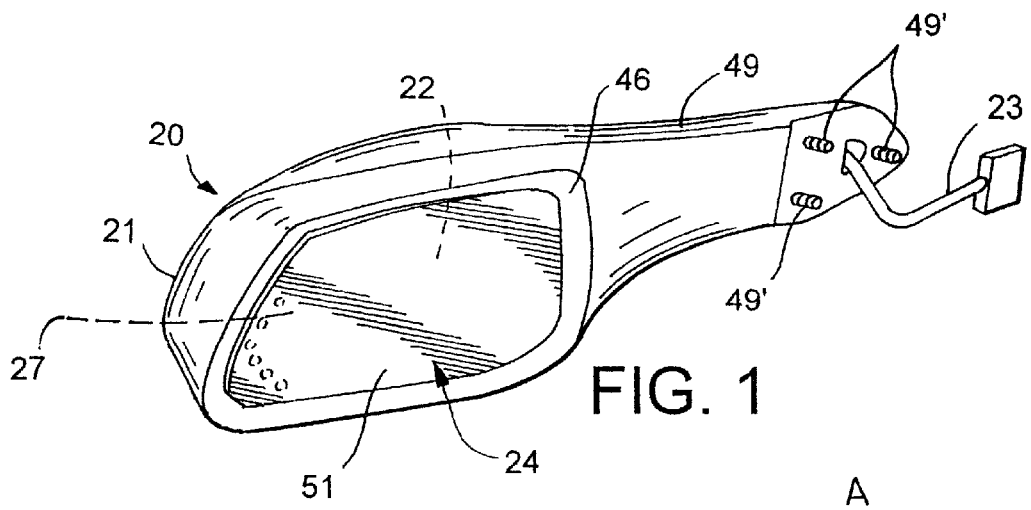
FIG. 1 is a perspective view of an exterior mirror assembly embodying the present invention.
Figure 2:
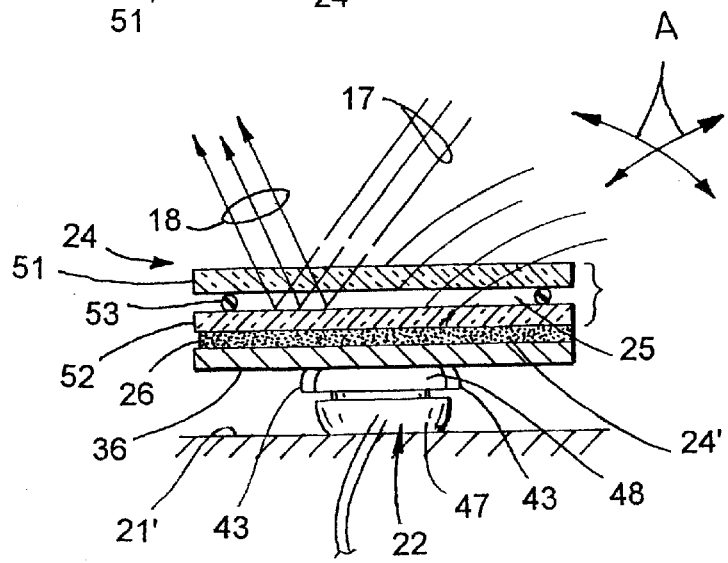
FIG. 2 is an enlarged schematic view of an angular adjustment mechanism (i.e. an electrical "power pack") attached to an electrochromic mirror subassembly, with the flexible fingers of the mirror carrier being bent in a manner causing distortion of reflected images.
Figure 2A:
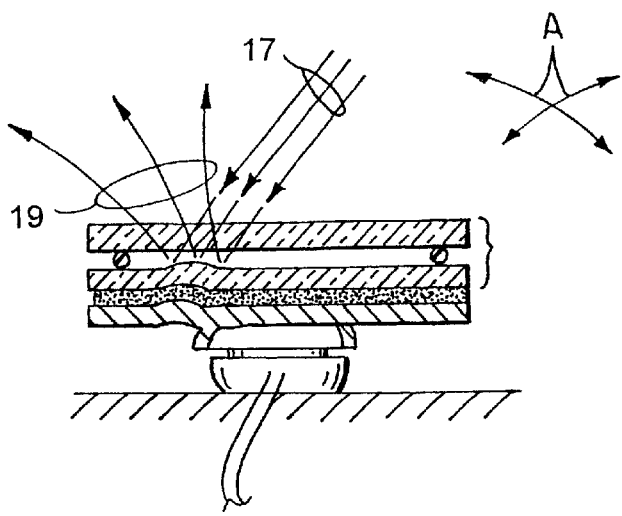
FIG. 2A is a cross section similar to FIG. 2, but showing a deformation of the glass elements in a mirror subassembly caused by bending of the carrier, leading to distortion of a reflected image.
Figure 6:
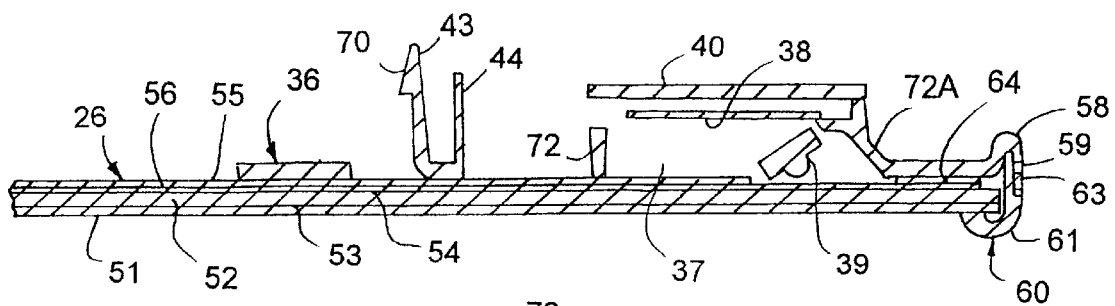
FIG. 6 is an enlarged view of the circuit-board-holding pocket of the carrier, which is an enlarged view of the right end of FIG. 4.
Figure 7:
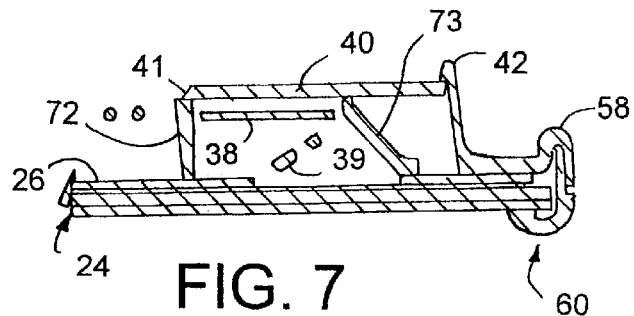
FIG. 7 is an enlarged cross-sectional view taken along the line VII—VII in FIG. 3.

The illustrated mirror assembly 20 (FIG. 1) includes a housing 21, an angular electrically-powered adjustment mechanism 22 (called a "power pack" herein) (FIG. 2) supported in and attached to a wall 21 in the housing 21, and main wiring bundle 23 (FIG. 1) for powering and controlling the power pack 22 and the other components in the mirror assembly 20. An electrochromic mirror subassembly 24 (FIG. 2) includes a carrier 36 snappingly attached to a multi-angularly-adjustable plate 48 on the power pack 22 in a manner that minimizes stress on the glass elements of the mirror subassembly 24, as described below. The present mirror assembly 20 is designed to prevent the problem illustrated in FIG. 2A, where resilient fingers on the carrier are stressed and have caused a deformation on the glass elements of the mirror subassembly, resulting in unacceptable distortion of reflected images, as represented by non-parallel reflected light beams 19. (Compare with FIG. 2, where three light beams 17 representing an image are reflected as an undistorted image represented by parallel light beams 18.) The mirror subassembly 24 (FIG. 2) further includes a layer of electrochromic material 25 and a heater 26, and also an integrally held turn signal device 27 (FIG. 3), each of which requires connection to a powering and control device on the vehicle, as described below.

Figure 12:
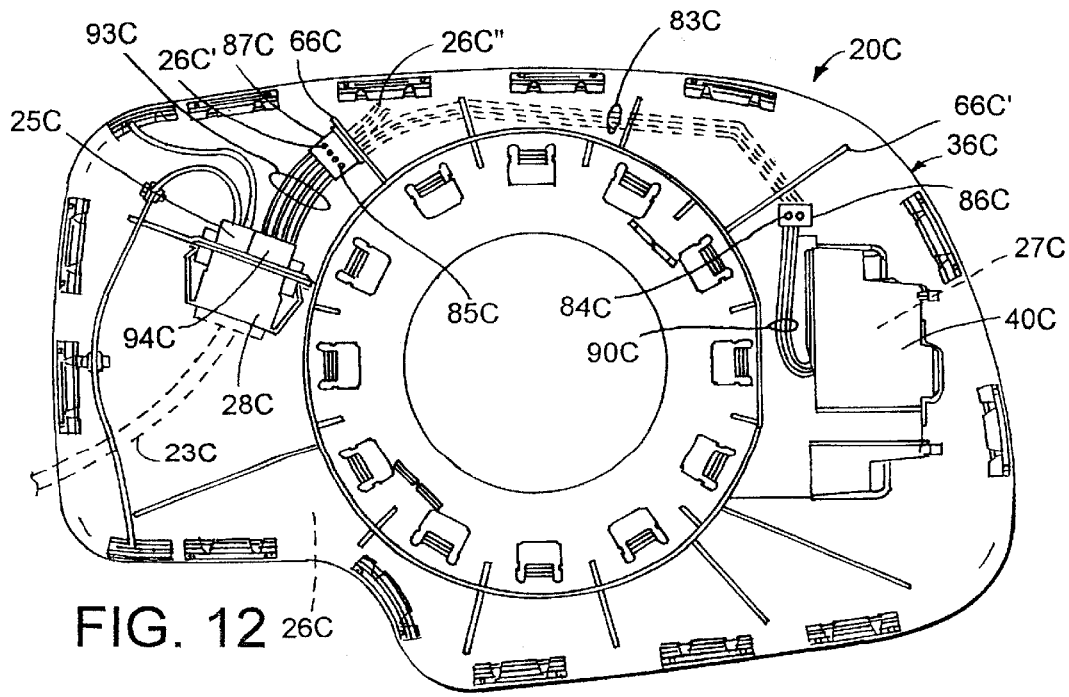
FIG. 12 is a rear view of a modified mirror subassembly, including an upstream two-into-one electrical connector and then a downstream two-into-one electrical connector.
Figure 13:
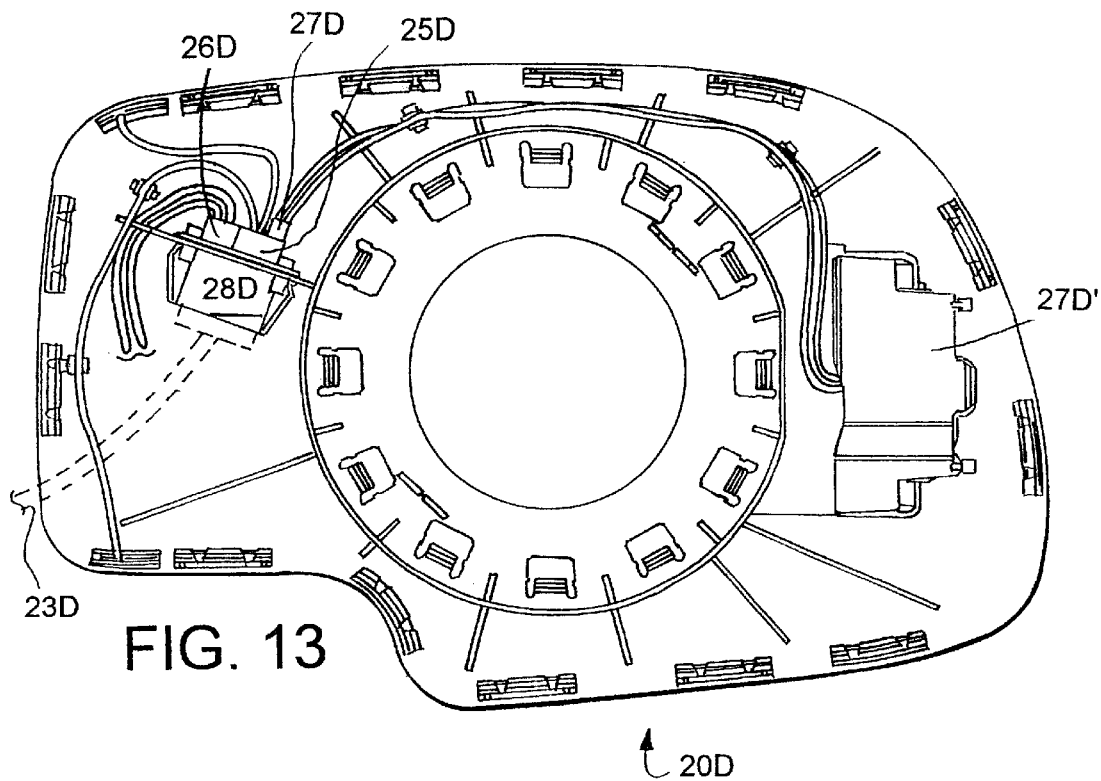
FIG. 13 is a rear view of another modified mirror subassembly, including a two-into-one electrical connector and also a "piggyback" electrical connector that plugs into or "piggybacks" onto a back of one of the first electrical connectors.
Figure 14:
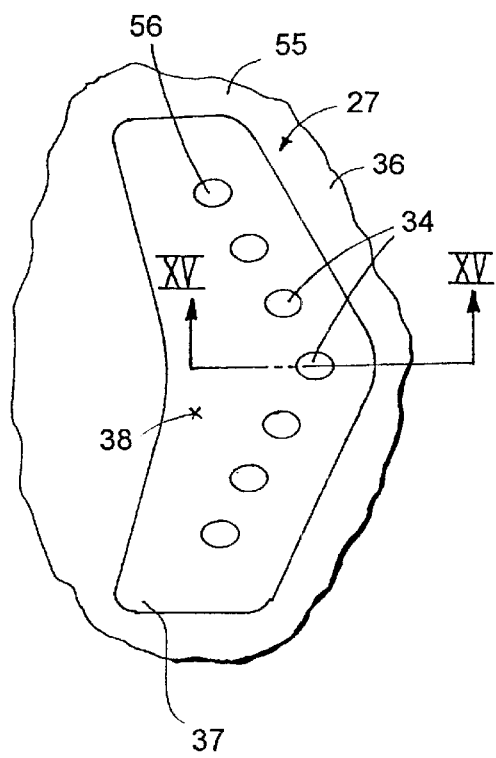
FIG. 14 is a fragmentary plan view of a heater including a light-blocking layer with apertures for letting light pass through, and including a light-passing layer treated to diffuse light passing therethrough.
Figure 15:
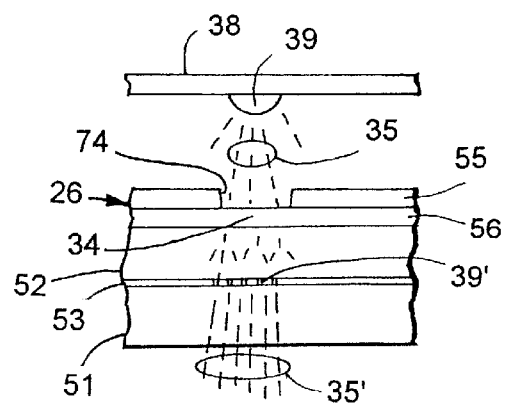
FIG. 15 is a cross-sectional view taken along line XV—XV in FIG. 14.

The components 25, 26, and 27 include individual connectors 25A, 26A, and 27A (FIG. 3) that each plug into a multi-prong, multi-receptacle main connector 28 or secondary connector 28A on the bundle of wires 23. Alternatively, it is contemplated that a pair of the connectors could piggyback into each other (see FIG. 13), with the bottom connector being plugged into the connector 28. Still another alternative is to use an "extension cord-type" arrangement where two two-prong connectors plug into a single four-prong connector and then downstream the extension cord's other connector plugs into the main connector (see FIG. 12). This arrangement can help provide flexibility for assembly, particularly when different options are used for the mirror assembly, the signal device, and the EC mirror subassembly, but also can help with repair and with control over the type, cost, and number of connectors. By this arrangement, commercially available "standard" connectors can be used instead of higher-cost "specialty" connectors. Another alternative arrangement includes a heater that incorporates an internal wire with end connectors for communicating power to opposite sides of the heater (FIG. 12). Optionally, the heater can also include sections of light-transmitting/diffusing material 34 (see FIGS. 14–15) for diffusing light 35 passing from the turn signal device 27 through the diffusing material 34.

The mirror subassembly 24 includes a panel-shaped carrier 36 (FIGS. 6–9) constructed to securely but releasably hold a circuit board 38 of the turn-signal device 27 and also constructed with a continuous hoop flange 44 for rigidity. More specifically, the mirror subassembly 24 includes flanges 72 and 72A forming a pocket 37. A printed circuit board 38 with light-generating devices 39 (such as LEDs) (FIG. 15) for generating a pattern of light for the turn signal fits into the pocket 37. A door retainer 40 (FIGS. 6–9) is integrally molded with the carrier 36, and includes an integral hinge 41 and snap-attach retainers 42 that releasably secure the door retainer 40 in a closed position for securing the printed circuit board 38 in the pocket 37. The carrier 36 also includes a ring-shaped array of resilient fingers or retainers 43 configured to snappingly engage a mounting plate on the power pack 22. A continuous hoop flange 44 (FIG. 3) of carrier 36 extends around the fingers 43 to prevent unacceptable distortion of the carrier 36 when the fingers 43 are attached to the power pack 22.

Exterior mirror housings such as housing 21 (FIG. 1) and also adjustable power packs such as power pack 22 (FIG. 2) are generally well known in the art, such that the present housing 21 and power pack 22 need not be described in great detail for an understanding of the present invention by a person skilled in the art of designing vehicle mirrors. It is sufficient to describe the housing 21 as including a front opening 46 in which the mirror subassembly 24 is adjustably held for angular adjustment by the power pack 22. The power pack 22 includes DC motors 47 for angularly adjusting an adjustable plate or mount 48 in orthogonal X-Y angular directions. The resilient fingers 43 on the carrier 36 snappingly engage the adjustable plate 48 in a manner that facilitates assembly via a low and consistent insertion force, yet positively retain the carrier 36 to the power pack 22 with a consistently high retention force, as described below. The housing 21 further includes a rigid structural arm 49 with attachment bolts 49' shaped for secure attachment to a vehicle body or door (not specifically shown).

The carrier 36 (FIGS. 3–4) includes a panel-like body section 50 shaped to fit inside the opening 46 of housing 21 and to support the mirror subassembly 24. The mirror subassembly 24 (FIG. 6) includes a front glass element 51 having a thickness of about 1.6-mm or that is more preferably about 1.1-mm or less, and a rear glass element 52 having a thickness of about 2.2-mm to 1.1-mm or that is more preferably about 1.6-mm. An electrochromic (EC) substance 53 is located between the glass elements 51 and 52. A reflector layer 54 is applied to a rear of the rear glass element 52 (i.e. a fourth surface reflector) (as illustrated) or to a front of the rear glass element 52 (i.e. a third surface reflector). It is contemplated that the EC substance can be a solution phase material, a solid phase material, a gel material, or a hybrid thereof or any other material that is darkenable in a controlled manner. A electrochromic mirror subassembly 24 of interest having low-thickness glass elements is described in detail in U.S. Pat. No. 6,195,194, which patent is incorporated in its entirety herein by reference.

The heater 26 includes a foam layer 55 and a plastic layer 56 (e.g. Mylar or stiff plastic) with conductive tracings 57 thereon that form the heater element. In the illustrated arrangement, the plastic layer 56 is adhered to the reflector layer 54, and the foam layer 55 is adhered to the plastic layer 56 but not adhered to the carrier 36. Notably, the plastic and foam layers 56 and 55 could be reversed, and/or the adhesive layer could be on the foam layer instead of the plastic layer. The illustrated lack of adhesion between the plastic layer 56 and the carrier 36 is a change from prior art that helps reduce stress on the glass elements 51 and 52. For example, such stress will occur due to non-uniform thermal expansion, such as may occur during the day and/or occur when the heater is first energized and is heating. This lack of adhesion helps to reduce unacceptable distortion of the glass elements 51 and 52 by permitting some slippage between the heater and the mirror subassembly 24.

The carrier 36 (FIG. 6) includes a perimeter section with a U-shaped edge flange 58 having an aperture 59. A bezel 60 includes a J-shaped body 61 that extends around a perimeter of the mirror subassembly 24, with a short end of the J-shaped body 61 engaging an area on the front glass 51 just inside of a perimeter of the front glass 51, and with a long end of the J-shaped body 61 extending past the glass elements 51 and 52 into a groove formed by the U-shaped edge flange 58. The long end of the J-shaped body 62 is resilient and flexible, and includes a plurality of hooks 63 shaped to snap into the apertures 59. Due to the shape of the mating U-shaped edge flange 58 and the bezel 60, the bezel 60 securely and reliably fits into the groove of the U-shaped edge flange 58 and snaps into the apertures 59. In particular, the shape of the U-shaped edge flange 58 permits an assembler to flex the U-shaped edge flange 58 forwardly, and permits an assembler to flex the short end of the J-shaped body 61 rearwardly, thus helping to assemble the bezel 60 onto the edge flange 58 without "overflexing" and non-uniformly stressing and/or deforming the mirror subassembly 24 or the bezel 60 or the carrier 36. Also, the arrangement helps prevent permanent "overflexing" or assembly-induced stress which would result in unacceptably/non-uniformly stressing or locally bending an edge of the mirror subassembly 24. The section 64 of foam layer 55 along the perimeter of the heater 26 forms a compressed sandwich with the mirror subassembly 24, the bezel 60 and the carrier 36, with the foam section 64 being compressed to about half its uncompressed thickness. Notably, the bezel 60 transmits compressive forces directly through the glass elements 51 and 52 of the mirror subassembly 24, thus substantially eliminating undesired torsional and bending stresses.

The carrier 36 also includes the hoop flange 44, which stabilizes and rigidifies the panel-like body section 50 of the carrier 36 around the power-pack-attachment section (i.e. around the resilient snap-attach fingers 43). The hoop flange 44 is continuous, such that it inherently has the strength and stress-distributing properties of a hoop. Further, the hoop flange 44 has a height of about 10-mm and a thickness at its top edge of about 0.8-mm. This ratio of dimensions is an optimal compromise permitting moldability (with minimal draft angle), while providing the strength and structure to provide support to resist resonant frequencies that can be problematic to an exterior mirror 20 in the field when a car is in service. Reinforcement ribs 66 (FIG. 3) extend radially from the outer edge surface of the hoop flange 44 for stabilizing the hoop flange 44 on a rear of the panel-like body section 50. The ribs 66 are located as needed. Some of the ribs 66 are extended to provide support locations for electrical connectors, such as rib 66A described below.

A hole 67 is located in the panel-like body section 50 in a middle area of the attachment section (i.e. in a middle area of the ring of fingers 43). The hole 67 prevents "oil canning", which is a condition that sometimes occurs on flat molded walls that are surrounded by rigid perimeter structure. "Oil canning" is the condition where flat material flexes between "in" and "out" bowed conditions. The presence of the hole 67 is consistent with the present structure, which emphasizes letting the glass element 51 and 52 of the mirror subassembly 24 float to an unstressed state, rather than attempting to continuously support the glass elements 50 and 51 in all locations across its rear surface. A U-shaped open area 69 is cut away from a root or base of the fingers 43 to provide additional flexure of these fingers 43. Specifically, the U-shaped open area 69 is cut into the panel-like body section 50 to allow the fingers 43 to flex in a direction perpendicular to the fingers 43. The U-shaped open area 69 causes the fingers 43 to flex open more easily, and lets them flex without disturbing and over-stressing the panel-like body section 50. At the same time, an installer can press directly on a back side of the fingers 43 to assure that the fingers 43 are all securely snapped onto the plate mount 48 on the power pack 22. The fingers 43 (FIG. 6) include a hook-shaped end having an angled surface 70 and they extend about 14-mm to 15-mm. The angled surface 70 is polished and/or otherwise treated to reduce the friction of insertion. By polishing the angled surface 70, insertion forces of under 50 pounds force (222 Newtons) have been achieved, which is surprisingly and unexpectedly low for assembling a mirror subassembly 24 onto a power pack 22. Many previous attempts have been made in the art to reduce insertion forces, while maintaining a sure and consistently tight fit. The present arrangement of polished hook surfaces and flexible fingers 43, in combination with the compressed foam of the heater 26, is believed to be novel and non-obvious to a person of ordinary skill in this art, based on the effort that has gone into coming to the present solution to the problem.

Figure 8:
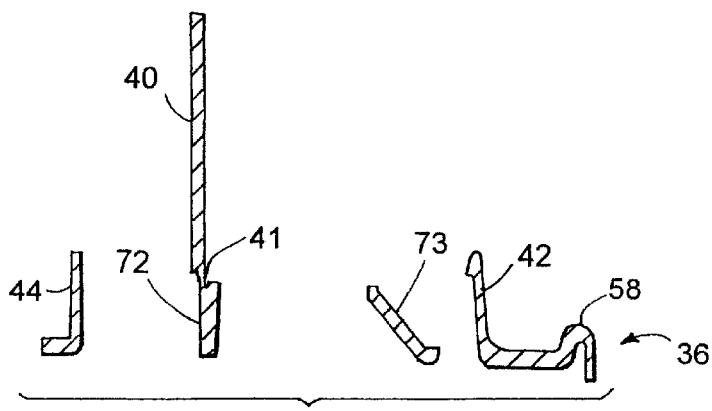
FIGS. 8 and 9 are cross-sectional views of the carrier and integrally molded door retainer, similar to FIG. 7 but showing only the carrier (i.e. the mirror subassembly and circuit board are not shown), FIG. 8 showing the door retainer in an open position and FIG. 9 showing the door retainer in a closed position (compare to FIG. 7)
Figure 9:
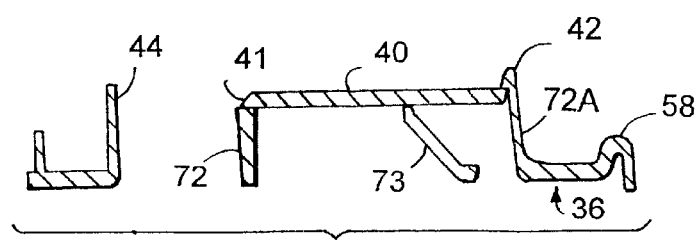

The carrier 36 is a molded component having flanges 72 and 72A (FIG. 6) on all sides forming a well-defined boomerang-shaped pocket 37. (See FIG. 14.) A circuit board 38 (FIG. 6) is crescent-shaped or boomerang-shaped to fit mateably into the pocket 37, with edges of the circuit board 38 being captured by the various flanges 72 and 72A. A resilient angled biasing flange 73 (FIG. 7) on the carrier 36 is shaped to engage a side edge of the circuit board 38 to assure non-rattling retention of the circuit board 38. The door-shaped retainer 40 is molded as shown in FIG. 8, but is bendable about integral living hinge 41 into snapping engagement with the integrally-molded retainers 42. When closed, the door-shaped retainer 40 includes an edge opposite the living hinge 41 that engages two hook-shaped retainers 42. However, it is to be understood that retainers (42) can be included to engage top and bottom edges of the retainer 40 as well. When closed, the door-shaped retainer 40 engages the resilient biasing flange 73 in a manner that compresses the retainer 40 against the blind surfaces on the hook retainers 42, thus assuring non-rattling securement of the door-shaped retainer 40. Notably, the living hinge 41 extends only about half a length of the door 40, such that wires 27A can be slid sideways into the hinge area and routed into the pocket 37 without interference from the door 40 or hinge 41 or flanges 72 and 72A. The circuit board 38 includes the light-generating devices 39 and circuits necessary for controlling the light-generating devices 39 to generate an arrow-shaped turn signal. It is noted that turn-signals have previously been put on external vehicle rearview mirrors (for example, see U.S. Pat. No. 6,166,848), but it is believed that no one has eliminated the separate turn signal housing shown in U.S. Pat. No. 6,166,848. The present apparatus incorporates the structure for holding the turn signal circuit board and LEDs into the carrier of the mirror subassembly itself. Notably, the illustrated carrier 36 is designed so that it can be molded by dies that do not have any die pulls, slides, cams, or moving components for making blind surfaces. This lowers cost, reduces maintenance, reduces capital investment, reduces scrap, and leads to an improved and more reliable manufacturing process and better parts.

The present structure further incorporates the turn signal device 27 into the mirror subassembly structure by using the plastic layer 56 (FIG. 15) of Mylar in the heater 26 as a diffuser for the light-generating devices 39 on the turn-signal device 27. Specifically, one or more apertures 74 are cut into the foam layer 55 of the heater 26. The apertures 74 can be cut entirely through the foam if the light generated by the turn signal device 27 is sufficiently dispersed to provide a uniformly lit turn signal. However, the illustrated heater 26 has a clear plastic layer 56 that extends across the pattern of apertures 74. The plastic layer 56 is Mylar or similar clear material, and at least the area of sections 34 at the apertures 74 is roughened or otherwise treated to form a light-spreading/diffusing surface 34 over the apertures 74. This surface causes the light 35 from LEDs 39 to diffuse into a more uniform distribution of light. Bars 39' (FIG. 15) in the windows on the EC material 53 and the relationship of components causes the emitted light 35' to be visible. By this method, the need for separate window/light diffusers on the light-generating devices 39 of the turn signal device 27 are eliminated. However, it is conceivable that the pattern of apertures 74 can be cut completely through the heater 26, and that a separate light diffusing panel(s) could be used instead of the above-described integrated light diffuser that is integrated into the heater 26.

The arrangement of connectors for interconnecting the electrically powered and controlled components of the present mirror assembly 20 is very important, since connectors take up space, particularly if not well-arranged, since each additional connector adds cost, and since they require manual labor to orient and snap together. Further, each additional connector is another opportunity for misconnection, and/or for an electrical short or dead connection. Connectors and wires also add weight and thickness to a mirror assembly. Four connector arrangements are described below, each solving one or more of the above problems and offering one or more of the above advantages.

Mirror assembly 20 (FIG. 3) includes the connector 26A, which comprises two protruding conductor leads 76 and 77 connected to the heating traces in the heater 26. The main wiring bundle 23 includes a first connector 28A for operably engaging leads 76 and 77. The main wiring bundle 23 further includes a second connector 28 that snap engages into or that is incorporated into a holder 81. Holder 81 is snap-attached into an aperture in reinforcement rib 66A. The connectors 25A and 27A are configured to snap side-by-side into the holder 81 and electrically connect to different conductors in the second connector 28 on the main wiring bundle 23. It is contemplated that the holder 81 can be incorporated into the 5 second connector 28 or into one of the connectors 25A and 27A, if desired. By plugging the two connectors 25A and 27A side-by-side into the single connector 28, the total number of connectors is reduced. Also, the orientation and snap engagement of the connectors 25A and 27A into connector 28 is easier since there is one location, and the first installed connector helps align and orient the second connector for installation. Also, the connectors 25A, 27A and 28 are located close to connector 28A and leads 76 and 77, which also facilitates an efficient assembly, since an assembler does not need to waste time "searching for" the connectors.

Figure 10:
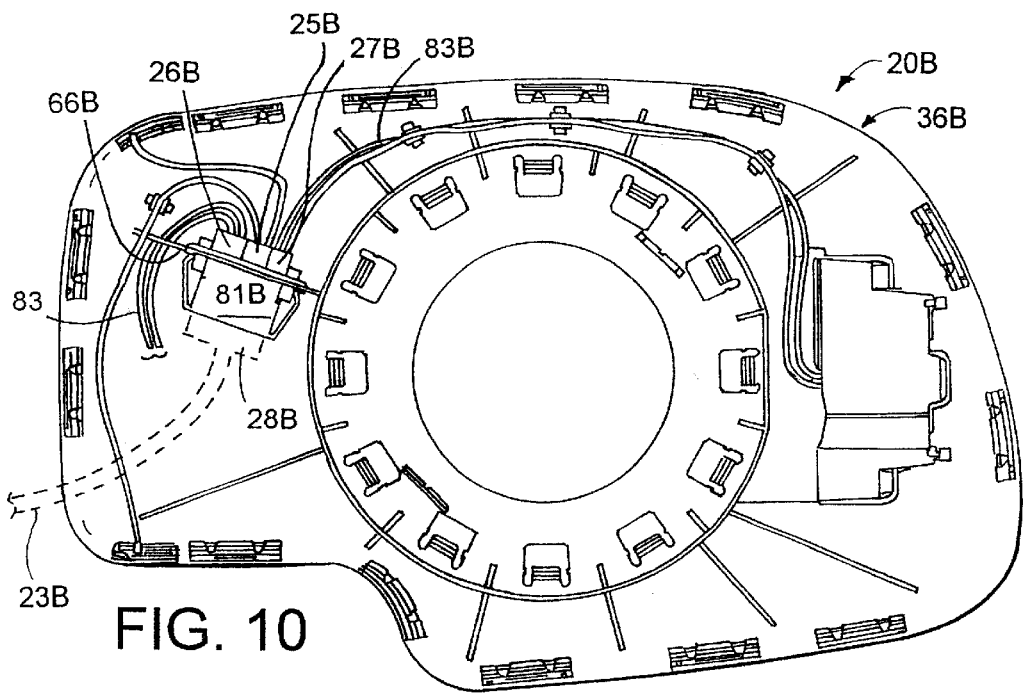
FIG. 10 is a rear view of a modified mirror subassembly, including a three-into-one electrical connector arrangement.
Figure 11:
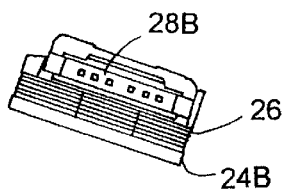
FIG. 11 is a fragmentary view of the three-into-one electrical connector of FIG. 10.

The mirror assembly 20B (FIGS. 10–11) includes wires 83B and a heater connector 26B that replace the heater leads 76 and 77. The main wiring bundle 23B includes a connector 28B having six prong conductors therein. Main wiring bundle connector 28B snaps into or is incorporated into the holder 81B, which is retained by rib 66B. The EC connector 25B, the heater connector 26B, and the turn signal device connector 27B each plug side-by-side-by-side into the connector 28B of the main wiring bundle 23B. As noted above, the side-by-side-by-side relationship of the connectors creates an arrangement that is more efficient to assemble, since all connectors are close together and further since previously installed connectors guide the later-installed connectors. As arranged, the wires of the connectors 25B, 26B and 27B do not overlap, thus leading to a flatter and well-arranged wiring pattern. Preferably, the connectors 25B, 26B, and 27B have different shapes so that they are not interchangeable and cannot be mis-assembled The mirror assembly 20C (FIG. 12) includes conductors 83C that are integrated into the heater 26C as part of the heater conductor tracings. The conductors 83C are used to connect the turn signal device 27C to the main wiring bundle 23C in an "extension cord" type arrangement. The turn signal conductors 83C can extend along any convenient path from the left side to the right side of the mirror subassembly 24C. The turn signal conductors 83C are shown in FIG. 12 as extending horizontally along an upper edge of the heater 26C for convenience so that they are easily seen in the drawing and so that they do not interfere with the heater tracings of the heater 26C. It is contemplated that the turn signal conductors 83C could act as heating elements as well, but this is not a preferred mode. Instead, it is contemplated that they will define a separate circuit extending between the turn signal device 27C and the main wires 23C.

The integrated turn signal conductors 83C can be electrically interconnected to the main connector 28C by various means. The illustrated turn signal conductors 83C include protruding paired ends 84C and 85C that are engaged by "L" connectors 86C and 87C, respectively. The turn signal device 27C is held to the carrier by door retainer 40C, and includes wires 90C connected to connector 86C. Connector 87C engages the downstream protruding paired ends 85C for the turn signal device 27C and further engages the protruding paired ends 26C' extending from heating tracings 26C ". Wires 93C electrically connect the four conductors of the connector 87C to the second connector 94C which in turn is connected to the main connector 28C. The connector 25C connects the electrochromic material of the EC mirror to the main connector 28C. Wires 23C extend from the main connector 28C and are connected to the vehicle electrical system.

Mirror 20D (FIG. 13) is similar to the mirror assembly 20B (FIG. 10), except the connector 27D from the turn signal device 27D' connects into a rear of the connector 25D in a "piggyback" style arrangement, and the connector 25D (which is four prong) plugs into the main connector 28D adjacent the "EC" connector 26D. More specifically, the connector 25D has two wires from the EC mirror subassembly hard wired into the connector 25D, and further has four output prongs for connection to main connector 28D. Connector 26D attaches to the main connector 28D beside connector 25D. Wires 23D extend from connector 28D for connection to the vehicle electrical system.

It is to be understood that variations and modifications can be made on the aforementioned structure without departing from the concepts of the present invention, and further it is to be understood that such concepts are intended to be covered by the following claims unless these claims by their language expressly state otherwise.

We claim:

1. A mirror assembly comprising:
an electrochromic mirror component including first electrical conductors operably connected to the electrochromic mirror component;
an electrically-operated second component associated with the electrochromic mirror component and that includes second electrical conductors operably connected to the electrically-operated second component;
a first connector, said first and second electrical conductors operably connected to said first connector; and
a primary wire bundle configured to communicate power to the electrochromic mirror component and to the electrically-operated second component, the primary wire bundle including a main connector, the first connector engaging and electrically connected to the main connector, whereby the primary wire bundle is configured to communicate power to the electrochromic mirror component and to the electrically-operated second component.

2. The mirror assembly defined in claim 1 and further comprising a second connector engaging and electrically connected to one of the main connector and the first connector.

3. The mirror assembly defined in claim 1, wherein the electrically-operated second component is a turn signal device adapted to generate a turn signal.

4. The mirror assembly defined in claim 1, wherein the first electrical conductors are electrically connected to a second connector that is connected to the main connector through the first connector.

5. The mirror assembly defined in claim 1, wherein the electrically-operated second component is a heater for heating the electrochromic mirror component.

6. The mirror assembly defined in claim 5, wherein the main connector has a least six terminals, two of the terminals being connected to a turn signal device, two of the terminals being connected to the electrochromic mirror component, and two of the terminals being connected to the heater.

7. The mirror assembly defined in claim 1, including a panel-shaped carrier, and wherein the main connector and also the electrochromic mirror component are attached to the carrier.

8. The mirror assembly defined in claim 1, including a housing with a laterally-extending structural arm that is adapted to support the electrochromic mirror component on an exterior of a vehicle body.

9. The mirror assembly defined in claim 8, wherein the electrochromic mirror component is operably supported in the housing for angular adjustment.

10. The mirror assembly defined in claim 9, including a power adjustment device releasably engaging the carrier and supporting the electrochromic mirror component in an opening in the housing.

11. The mirror assembly defined in claim 1, and further comprising a heater, wherein the second component is a turn signal device, and wherein the first conductors are internally integrated into the heater to provide electrical power from the main connector across the heater to the turn signal device.

12. A rearview mirror assembly for a vehicle comprising:
a mirror subassembly including a panel-shaped carrier;
first and second electrically-operated components associated with the mirror subassembly and including first and second connectors, respectively; and
a primary wire bundle extending from and configured to communicate power to the first and second components, the primary wire bundle including a main connector, the first and second connectors engaging and electrically directly connected to the main connector, whereby the primary wire bundle and the first and second connectors are configured to communicate power to the first and second components.

13. A rearview mirror assembly for a vehicle comprising:
a mirror subassembly; and
a heater positioned relative to the mirror subassembly for heating the mirror subassembly, the heater including a first connector on one portion of the heater that is adapted for connection to a power source and a second connector on another portion of the heater with an electrical conductor extending through and across the heater and connecting the first and second connectors, whereby electrical energy can be communicated by the electrical conductor to different portions of the heater for operating an electrically-operated component associated with the mirror subassembly.

14. The rearview mirror assembly defined in claim 13, including an electrically-operated component associated with the mirror subassembly that includes a third connector constructed to operably engage the second connector.

15. The rearview mirror assembly defined in claim 14, wherein the electrically-operated component comprises a turn signal device for generating a visible turn signal.

16. The rearview mirror assembly defined in claim 14, including a primary wire bundle extending from and configured to communicate power to the heater and to the electrically-operated component, the primary wire bundle including a main connector engaging and electrically connected to the first connector, and the second connector engaging and electrically connected to the third connector, whereby the primary wire bundle is configured to communicate power to the electrically-operated component.

17. The rearview mirror assembly defined in claim 13, wherein the mirror subassembly includes electrochromic material for controlled darkening of a reflected image.

18. The rearview mirror assembly defined in claim 13, including a panel-shaped carrier supporting the mirror subassembly, and including a power-supplying main connector attached to the panel-shaped carrier, the first connector being attached to the main connector.

19. A rearview mirror assembly for a vehicle comprising:
a mirror subassembly;
a heater positioned relative to the mirror subassembly for heating the mirror subassembly, the heater being multi-layered and including a polymeric layer of light-transmitting material and including another layer of opaque material with at least one aperture therein for letting light pass through at least a portion of the light-transmitting material; and
a light source directing light at the portion, whereby the portion diffuses the light so that the light passing therethrough is uniformly distributed.

20. The rearview mirror assembly defined in claim 19, wherein the light-transmitting material includes a translucent portion covering the aperture.

21. The rearview mirror assembly defined in claim 19, wherein the at least one aperture includes a pattern of apertures.

22. The rearview mirror assembly defined in claim 19, including a light source positioned to direct light through the at least one aperture.

23. A mirror comprising:
an electrochromic mirror subassembly including a panel-shaped carrier with flanges defining a pocket;

a printed circuit board positioned in the pocket; and a releasable retainer releasably retaining the printed circuit board in the pocket.

24. The mirror defined in claim 23, including a housing with an arm extending from the housing that is configured and adapted for attachment to an exterior of a vehicle.

25. The mirror defined in claim 23, including an electrically operated component, and wherein the circuit board is configured to operate the electrically operated component.

26. The mirror defined in claim 25, and wherein the electrically operated component is a turn signal device.

27. The mirror defined in claim 23, wherein the retainer includes a door for covering a recess in the carrier.

28. The mirror defined in claim 27, wherein the retainer is attached to the carrier by a living hinge.

29. The mirror defined in claim 23, including resilient fingers integrally formed of material contiguous with the carrier and shaped to snappingly engage and secure the retainer.

30. The mirror defined in claim 27, wherein the retainer is integrally formed of material contiguous with the carrier and is attached to the carrier with a living hinge, and including integrally formed catches on the carrier for snappingly engaging the door to retainer the door in a closed position.

31. The mirror defined in claim 23, wherein the retainer is integrally molded as part of the carrier.

32. The mirror defined in claim 23, wherein the carrier includes a living hinge connecting the retainer to the carrier and further is made without blind surfaces so that the carrier can be molded with dies not having pulls, slides or other movable components for making blind surfaces.

33. The mirror defined in claim 32, including a first catch on a side of the retainer opposite the living hinge.

34. The mirror defined in claim 33, further comprising a second catch on a side 90° from the first catch.

35. The mirror defined in claim 23, wherein the circuit board includes light sources for generating visible light.

36. The mirror defined in claim 35, wherein the light sources are positioned to form a pattern suitable for use as a turn signal indicator.

37. The mirror defined in claim 23, wherein the carrier includes a pressure foot in the pocket shaped to prevent looseness and rattling of the circuit board when the retainer is holding the circuit board.

38. An exterior rearview mirror comprising:

a mirror subassembly including a panel-shaped carrier;

a printed circuit board attached to the panel-shaped carrier, the printed circuit board including light-generating devices positioned behind the mirror subassembly to generate a visible turn signal and including at least a portion of a circuit for controlling the light-generating devices; and a retainer securing the printed circuit board to the mirror subassembly without using a separate housing for the printed circuit board.

39. The exterior rearview mirror defined in claim 38, wherein the carrier includes flanges forming an integral housing for the circuit board.

40. The exterior rearview mirror defined in claim 38, wherein the retainer is releasable so that the circuit board can be removed and replaced.

41. The exterior rearview mirror defined in claim 38, wherein the retainer forms a door that covers and protects the circuit board.

42. A mirror subassembly for use in a rearview mirror assembly having a housing and a power pack attached to the housing and including an angularly adjustable mount, said mirror subassembly comprising:

an electrochromic mirror subassembly including front and rear glass elements and an electrochromic layer adapted to provide controlled darkening of reflected images, and further including a panel-shaped carrier with a front surface shaped to uniformly support the rear glass element, the panel-shaped carrier including a plurality of resilient retainers arranged in a circle and extending rearwardly from the panel-shaped carrier and engaging the adjustable mount and further including a continuous hoop-shaped wall extending around and spaced radially from the plurality of resilient retainers, the hoop-shaped wall extending from the rear surface and supporting an area around and proximate a base of the plurality of resilient retainers.

43. The mirror subassembly defined in claim 42, wherein the hoop-shaped wall defines a constant radius.

44. The mirror subassembly defined in claim 42, wherein the hoop-shaped wall has a constant height relative to a rear surface of the carrier.

45. The mirror subassembly defined in claim 42, wherein the hoop-shaped wall has constant cross-sectional shape and thickness around the wall's entire length.

46. The mirror subassembly defined in claim 42, including marginal material defining an enlarged hole centered inside of the retainers, the marginal material forming a continuous ring inside of the retainers at a base of the retainers.

47. The mirror subassembly defined in claim 42, wherein the retainers define flexible fingers with hooked ends.

48. The mirror subassembly defined in claim 42, wherein the retainers are uniformly spaced apart in a circumferential direction.

49. The mirror subassembly defined in claim 42, wherein the mirror subassembly includes a rear glass element that is 1.6-mm or less in thickness.

50. The mirror subassembly defined in claim 42, wherein the mirror subassembly includes a front glass element that is 1.6-mm or less in thickness.

51. The mirror subassembly defined in claim 42, wherein the mirror subassembly includes a front glass element and a rear glass element, at least one of which is 1.1-mm or less in thickness.

52. The mirror subassembly defined in claim 51, wherein the rear glass element is adhered to the panel-shaped carrier.

53. A mirror subassembly for use in a rearview mirror assembly having a housing and a power angle adjustment device attached to the housing and including an angularly adjustable mount, said mirror subassembly comprising:

an electrochromic mirror subassembly including front and rear glass elements and an electrochromic layer adapted to provide controlled darkening of reflected images, and further including a panel-shaped carrier with a front surface shaped to uniformly support the rear glass element, the panel-shaped carrier including a plurality of resilient retainers arranged in a circle and extending rearwardly from the panel-shaped carrier and engaging the adjustable mount, the retainers and adjustable mount being configured to positively engage for secure retention but also configured to provide an insertion attachment force of less than 50 pounds force (222 N) during assembly of the panel-shaped carrier to the power pack.

54. The mirror subassembly defined in claim 53, including a resilient ring on the carrier inside of the retainers that abuts the adjustment device and is compressed between the adjustment device and the carrier upon assembly.

55. The mirror subassembly defined in claim 53, wherein the panel-shaped carrier includes continuous rings of material radially inside and outside of the retainers to distribute the insertion attachment force uniformly over an extended area of the mirror subassembly.

56. The mirror subassembly defined in claim 53, wherein the retainers have inclined surfaces configured to provide low friction.

57. The mirror subassembly defined in claim 56, wherein the inclined surfaces are smooth and formed on a polished die surface.

58. The mirror subassembly defined in claim 53, including a foam positioned between the adjustable mount and the carrier, and wherein the retainers grippingly engage the adjustable mount while compressing the foam.

59. A mirror subassembly for use in a rearview mirror assembly having a housing including an arm adapting the housing for attachment to a vehicle in a position outside of the vehicle and a power pack attached to the housing and including an angularly adjustable mount, said mirror subassembly comprising:

an electrochromic mirror;

a carrier for the electrochromic mirror, the carrier including a panel-like surface supporting the electrochromic mirror and including retainers adapted for engaging the adjustable mount, the carrier including a plurality of apertures inboard of a perimeter of the carrier but outboard of a perimeter of the electrochromic mirror; and a bezel with a plurality of resilient hooks that extend past the perimeter of the electrochromic mirror and into the plurality of apertures.

60. A mirror assembly comprising:

an electrochromic mirror component including first electrical conductors operably connected to the electrochromic mirror component;

an electrically-operated second component associated with the electrochromic mirror component and that includes second electrical conductors operably connected to the electrically-operated second component; and a common connector, said first and second electrical conductors operably connected to said common connector, wherein said common connector is configured for engaging and electrically connecting to a main connector of a primary wire bundle, which supplies power to the electrochromic mirror component and to the electrically-operated second component.

61. The mirror assembly defined in claim 60, wherein the electrically-operated second component is a turn signal device adapted to generate a turn signal.

62. A mirror assembly comprising:

an electrochromic mirror component including first electrical conductors operably connected to the electrochromic mirror component;

an electrically-operated second component associated with the electrochromic mirror component and that includes second electrical conductor operably connected to the electrically-operated second component; and an electrically-operated third component associated with the electrochromic mirror component and that includes second electrical conductors operably connected to the electrically-operated second component; and a common connector, wherein at least two of said first, second, and third electrical conductors are operably connected to said common connector, wherein said common connector is configured for engaging and electrically connecting to a main connector of a primary wire bundle, which supplies power to at least two of the electrochromic mirror component, the electrically-operated second component, and the electrically-operated third component.

* * * * *